United States Patent
Harada et al.

(10) Patent No.: US 7,045,208 B2
(45) Date of Patent: *May 16, 2006

(54) SYNTHETIC RESIN MOLDED MATERIAL AND METHOD FOR ITS PRODUCTION

(75) Inventors: Kazuo Harada, Yokohama (JP); Atsushi Hayashi, Yokohama (JP); Tatsuo Momii, Yokohama (JP); Teruo Takakura, Yokohama (JP); Seitoku Kaya, Yokohama (JP)

(73) Assignee: Asahi Glass Company Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/919,434

(22) Filed: Aug. 17, 2004

(65) Prior Publication Data

US 2005/0019617 A1    Jan. 27, 2005

Related U.S. Application Data

(60) Continuation of application No. 10/612,956, filed on Jul. 7, 2003, now Pat. No. 6,803,098, which is a division of application No. 10/115,238, filed on Apr. 4, 2002, now Pat. No. 6,651,381, which is a division of application No. 08/875,496, filed as application No. PCT/JP96/00197 on Feb. 1, 1996, now abandoned.

(30) Foreign Application Priority Data

Feb. 1, 1995    (JP) ...................................... 7-15307

(51) Int. Cl.
B32B 27/00 (2006.01)
B32B 13/12 (2006.01)

(52) U.S. Cl. ............ 428/336; 204/192.14; 204/192.15; 428/421; 428/422; 428/451

(58) Field of Classification Search .......... 204/192.14, 204/192.15; 428/336, 421, 422, 451
See application file for complete search history.

(56) References Cited

U.S. PATENT DOCUMENTS

| 3,442,686 A | 5/1969 | Jones ........................ 428/336 |
| 3,814,051 A | 6/1974 | Lewison ..................... 118/728 |
| 4,576,864 A | 3/1986 | Krautter et al. ............. 428/328 |
| 4,765,729 A | 8/1988 | Taniguchi ................... 351/163 |
| 5,462,779 A | 10/1995 | Misiano et al. ............ 428/34.7 |
| 5,725,958 A | 3/1998 | Matsuda et al. ............ 428/446 |

FOREIGN PATENT DOCUMENTS

| EP | 0 460 796 | 12/1991 |
| EP | 0 549 528 | 6/1993 |
| GB | 2 211 516 | 7/1989 |
| JP | 49-46073 | 4/1974 |
| JP | 49-50563 | 5/1974 |
| JP | 59-150816 | 10/1984 |
| JP | 60-29464 | 2/1985 |
| JP | 60-134068 | 7/1985 |
| JP | 60210641 | 10/1985 |
| JP | 1-79953 | 5/1989 |
| JP | 01-218527 | 8/1989 |
| JP | 03-101927 | 4/1991 |
| JP | 4-129734 | 8/1992 |

*Primary Examiner*—D. S. Nakarani
(74) *Attorney, Agent, or Firm*—Oblon, Spivak, McClelland, Maier & Neustadt, P.C.

(57) ABSTRACT

A synthetic resin molded material characterized in that a thin film made of an oxide of at least one metal selected from the group consisting of Si, Zr, Ti, Ta, Hf, Mo, W. Nb, Sn, In, Al and Zn, is formed by a dry method on a synthetic resin substrate having hydrophobicity, and a method for its production.

18 Claims, No Drawings

SYNTHETIC RESIN MOLDED MATERIAL AND METHOD FOR ITS PRODUCTION

This is a continuation application of U.S. application Ser. No. 10/612,956, filed Jul. 7, 2003, now U.S. Pat. No. 6,803,098, which is a divisional application of U.S. application Ser. No. 10/115,238, filed Apr. 4, 2002, now U.S. Pat. No. 6,651,381, which is a divisional application of U.S. application Ser. No. 08/875,496, filed Aug. 1, 1997, now abandoned, which is the National Stage of International PCT application Ser. No. PCT/JP96/00197, filed Feb. 1, 1996.

TECHNICAL FIELD

The present invention relates to a synthetic resin molded material and a method for its production.

BACKGROUND ART

Heretofore, a synthetic resin substrate having hydrophobicity has sometimes had a trouble attributable to the hydrophobicity. For example, a fluorine-containing resin film as a typical example of a synthetic resin substrate having hydrophobicity, is excellent in transparency, durability, weather resistance, antisoiling property, etc., and by virtue of such characteristics, it has been used as a film for an agricultural or horticultural house instead of a vinyl chloride resin. However, when a fluorine-containing resin film is used for an agricultural or horticultural house, moisture condensation is likely to form on the inside surface of the film as the film has no hydrophilicity, whereby problems are likely to result such that sunlights required for the growth of plants tend to be blocked, or deposited water drops are likely to drop directly on crop plants instead of flowing in the form of a water film on the film surface, to present adverse effects.

To solve such problems, as a method for imparting hydrophilicity to the surface of a synthetic resin substrate, a coating method has heretofore reported in which a mixture of a silica-type sol and a surfactant, is coated on the resin surface, followed by drying to impart hydrophilicity (e.g. JP-A-62-179938, JP-A-5-59202 and JP-A-5-59203).

However, with the hydrophilic film obtained by this method, the hydrophilicity does not last for a long period of time, and in a case where it is used for a synthetic resin which has a long useful life like a fluorine resin film, there has been a problem that costs and time will be required, as it is necessary to carry out recoating periodically.

The present invention is intended to solve the above-mentioned problems of the prior art and to provide a synthetic resin molded material having adequate hydrophilicity, whereby the hydrophilicity will last for a long period of time.

DISCLOSURE OF THE INVENTION

The present invention provides a synthetic resin molded material characterized in that a thin film made of an oxide of at least one metal selected from the group consisting of Si, Zr, Ti, Ta, Hf, Mo, W, Nb, Sn, In, Al, Cr and Zn is formed by a dry method on a synthetic resin substrate having hydrophobicity.

In the present invention, it is important to form the thin film made of an oxide of at least one metal selected from the group consisting of Si, Zr, Ti, Ta, Hf, Mo, W, Nb, Sn, In, Al, Cr and Zn by a dry method, whereby a desired synthetic resin substrate having hydrophobicity can effectively be made hydrophilic.

The above treatment to impart hydrophilicity is to modify the hydrophobic synthetic resin surface to be hydrophilic. As a result, a drop flowing property (a property to let water drops deposited on the surface flow), an antifogging property (a property to prevent fogging by moisture condensation), an anti-mist property (a property to prevent a mist attributable to water drops deposited on the film surface), an antistatic property (a property to prevent electrification of static electricity), a wettability (a nature to be readily wetted) or the like will be improved.

The thin film of an oxide to be used in the present invention, is not particularly limited so long as it is an oxide of at least one metal selected from the group consisting of Si, Zr, Ti, Ta, Hf, Mo, W, Nb, Sn, In, Al, Cr and Zn.

It is preferably a thin film made of an oxide of a metal containing at least Si, since it is thereby possible to obtain high hydrophilicity. This is believed to be attributable to the fact that Si present on the outermost surface of the thin film layer and moisture present in the atmosphere will bond to form a highly hydrophilic SiOH state.

Specific examples of the oxide of a metal containing at least Si, include oxides comprising $SiO_2$, oxides of Si and Zr, oxides of Si and Ti, oxides of Si and Ta, oxides of Si and Nb, oxides of Si and Sn, oxides of Si and Zn, or oxides of Si, Sn and Ti, as the main components.

From the viewpoint of the initial hydrophilicity, the durability of hydrophilicity for a long period of time and the material cost, an oxide comprising $SiO_2$ as the main component is preferred.

From the viewpoint of the initial hydrophilicity, the durability of hydrophilicity for a long period of time, the adhesion to the substrate and the productivity, oxides comprising oxides of Si and Sn, oxides of Si and Zr, or oxides of Si and Ti, as the main components, are preferred. Particularly preferred are oxides comprising oxides of Si and Sn as the main component.

Further, with a view to providing a photocatalytic function so as to provide an effect for decomposing or preventing deposition of a stain, by irradiation of sunlight, against deposition of a stain which is considered to be one of factors to prevent the long lasting effect of hydrophilicity, oxides comprising oxides of Si and Sn, oxides of Si and Ti, or oxides of Si, Sn and Ti, as the main components, are preferred.

From the viewpoint of providing various properties including the above-mentioned drop flowing property, the thickness of the thin film of an oxide in the present invention is preferably at least 3 nm. Further, from the viewpoint of maintenance of visible light transmittance, maintenance of flexibility of the synthetic resin substrate and adhesion to the substrate, the thickness is preferably at most 100 nm, more preferably at most 30 nm.

In a case where the thin film of an oxide in the present invention contains at least Si, the proportion of Si is preferably such that Si is from 20 to 80 atomic %, more preferably from 30 to 70 atomic %, to the total metals.

By adjusting the proportion of Si within the above range, it is possible to obtain effects such that 1) by the effect of contained Si, the refractive index of the oxide film can be properly made small, and it is possible to obtain a synthetic resin molded material having a desired color, 2) by the effect of metal components other than Si, the above-mentioned various properties including the drop flowing property can be obtained even when the oxide film is made thin, and 3) when a direct current sputtering method is employed as a film forming method, arching can be prevented by using an alloy target having a compositional range similar to that of the oxide film.

The contact angle to water of the oxide film tends to increase as the time passes from immediately after the film formation. However, the larger the proportion of Si (for example when Si is at least 50 atomic %), the smaller the change with time of the contact angle to water.

On the other hand, in a case where an alloy target is employed, if the proportion of Si increases, the film-forming speed tends to decrease. Accordingly, from the viewpoint of the productivity, Si is preferably at most 70 atomic %.

In the present invention, the method for obtaining the thin film of an oxide is not particularly limited so long as it is a dry method. With the dry method, the film can be made uniform, and the adhesion of the formed film to the substrate is high, as compared with a wet system. Accordingly, the dry method is one of important requirements for accomplishing the object of the present invention.

The dry method may, for example, be a vacuum vapor deposition method, a sputtering method, a CVD method or an ion plating method. Particularly preferred is a sputtering method, since it is excellent in the productivity and is widely used on an industrial scale, and it is possible to obtain by the method a film which is very dense and has high adhesion to the substrate, in a uniform film thickness.

The sputtering method may be a direct current sputtering method or a radio frequency sputtering method. A direct current sputtering method is preferred, since it is thereby possible to form a film efficiently at a high film forming speed on a substrate having a large surface.

As an example of a film of the oxide comprising $SiO_2$ as the main component, a thin film made of $SiO_2$ may be mentioned. The thin film made of $SiO_2$ can be obtained by forming a film by a radio frequency sputtering method in an oxygen-containing atmosphere using a Si target. It can also be obtained by forming a film by a radio frequency sputtering method in an oxygen-free atmosphere using a $SiO_2$ target. Further, it can be obtained by a direct current sputtering method wherein an intermittent negative direct current voltage is applied to the target, instead of the radio frequency sputtering method.

The power density to the target during sputtering is usually from 1 to 20 $W/cm^2$, and the gas pressure is usually from 1 to 10 mTorr, preferably from 2 to 6 mTorr.

As an example of the film of oxides comprising oxides of Si and Sn as the main components, a thin film made of oxides of Si and Sn may be mentioned. The thin film made of oxides of Si and Sn can be obtained by forming a film by a reactive sputtering method in an oxygen-containing atmosphere using a target of a mixture of Si and Sn.

In a case where the target of a mixture of Si and Sn is used, it is possible to use a usual direct current sputtering method from such a reason as improvement of the electrical conductivity of the target, and the film forming speed can be increased, as is different from the above-mentioned Si target. Here, by adopting a method of applying an intermittent negative direct current voltage to the target, it is possible to effectively suppress arching during the film formation, to increase the applied power and to maintain a high film-forming speed for a long period of time. Further, the covering rate over the surface of the resin substrate is improved, whereby the minimum film thickness to provide the water dropping property will decrease, which is advantageous also from the viewpoint of the productivity and the economical efficiency.

Similar effects can be obtained also in a case where a target comprising Si and at least one other metal selected from the group consisting of Zr, Ti, Ta, Hf, Mo, W, Nb, In, Al, Cr and Zn, is used. Especially when a target of a Si-Sn type metal is used, the film forming speed is high, and the productivity is excellent.

The above-mentioned target made of Si and Sn may be in the form of a mixture or in the form of an alloy. For example, a target of a mixture of Si and Sn can be obtained by molding a mixture of Si and Sn by a CIP method (a cold isotropic press method) or a hot press (a molding press at a temperature immediately below the melting point of Sn).

The synthetic resin substrate having hydrophobicity to be used in the present invention is not particularly limited, and a thermoplastic synthetic resin having hydrophobicity or a thermosetting synthetic resin having hydrophobicity can be used.

The thermoplastic synthetic resin may, for example, be a fluorine-containing resin, an acrylic resin, a polycarbonate resin, a polyester resin, a polyamide resin, a vinyl chloride resin, an olefin type resin, a polyacetal resin, a polyether imide resin, a polyether sulfone resin, a polyether ketone resin, a polyphenylene sulfide resin, a polysulfone resin, a polyallylate resin, a polyethylene naphthalate resin, a polymethylpentene resin, an ABS resin, a vinyl acetate resin or a polystyrene resin.

Among these, a fluorine-containing resin, an acrylic resin, a polycarbonate resin, a polyester resin, a polyamide resin, a vinyl chloride resin and an olefin type resin are preferred from the viewpoint of transparency and moldability. Particularly preferred are a fluorine-containing resin, an acrylic resin, a polycarbonate resin and a polyester resin.

Among them, a fluorine-containing resin is particularly preferred, since it is excellent in transparency, durability, weather resistance and stain-proofing property, and it undergoes no modification even during film formation in an oxygen-containing atmosphere. Further, it is considered that since the resin itself is expensive, it deserves for a dry surface treatment, the treating cost of which is relatively high.

Here, the fluorine-containing resin is meant for a thermoplastic resin containing fluorine in the molecular structure of the resin. Specifically, it may, for example, be a tetrafluoroethylene type resin, a chlorotrifluoroethylene type resin, a vinylidene fluoride type resin, a vinyl fluoride type resin or a composite of these resins. Particularly preferred is a tetrafluoroethylene type resin from the viewpoint of hydrophobicity.

Specifically, the tetrafluoroethylene type resin may, for example, be a tetrafluoroethylene resin (PTFE), a tetrafluoroethylene/perfluoro (alkoxyethylene) copolymer (PFA), a tetrafluoroethylene/hexafluoropropylene/perfluoro (alkoxyethylene) copolymer (EPE), a tetrafluoroethylene/hexafluoropropylene copolymer (FEP) or a tetrafluoroethylene/ethylene copolymer (ETFE).

Among them, PFA, ETFE, FEP or EPE is preferred from the viewpoint of moldability. Particularly preferred is ETFE, since it has mechanical strength durable for use outdoors for a long period of time. ETFE is the one composed mainly of ethylene and tetrafluoroethylene and a small amount of comonomer components may be copolymerized, as the case requires.

The comonomer components are monomers copolymerizable with tetrafluoroethylene and ethylene and may, for example, be the following compounds.

Fluorine-containing ethylenes such as $CF_2=CFCl$ and $CF_2=CH_2$;

fluorine-containing propylenes such as $CF_2=CFCF_3$, and $CF_2=CHCF_3$;

fluorine-containing alkylethylenes wherein the carbon number in the fluoroalkyl group is from 2 to 10, such as $CH_2=CHC_2F_5$, $CH_2=CHC_4F_9$, $CH_2=CFC_4F_9$, and $CH_2=CF(CF_2)_3H$;

perfluoro (alkylvinyl ethers) such as $CF_2=CFO(CF_2CFXO)_mR_f$ (wherein $R_f$ is a $C_{1-6}$ perfluoroalkyl group, X is a fluorine atom or a trifluoromethyl group and m is an integer of from 1 to 5);

vinyl ethers having a group which can readily be converted to a carboxylic acid group or a sulfonic acid group, such as $CF_2=CFOCF_2CF_2CF_2COOCH_3$, and $CF_2=CFOCF_2CF(CF_3)OCF_2CF_2SO_2F$.

The molar ratio of ethylene/tetrafluoroethylene in ETFE is preferably from 40/60 to 70/30, more preferably from 40/60 to 60/40. The content of comonomer components is preferably from 0.3 to 10 mol %, more preferably from 0.3 to 5 mol %, to the total monomers.

Specifically, the chlorotrifluoroethylene type resin may, for example, be a chlorotrifluoroethylene homopolymer (CTFE) or an ethylene/chlorotrifluoroethylene copolymer (ECTFE).

In the present invention, a mixed type resin containing the above fluorine-containing resin as the main component and having other thermoplastic resin incorporated, may also be preferably employed.

The thermosetting synthetic resin may, for example, be a melamine resin, a phenol resin, a urea resin, a furan resin, an alkyd resin, an unsaturated polyester resin, a diallylphthalate resin, an epoxy resin, a silicon resin, a polyurethane resin, a polyimide resin or a polyparabanic acid resin.

The form of the synthetic resin substrate to be used in the present invention, is not particularly limited. A substrate of a film form, a sheet form or a plate form is preferred.

The thickness of the synthetic resin substrate having hydrophobicity to be used in the present invention is preferably thin from the viewpoint of visible light transmittance. On the other hand, it is preferably thick from the viewpoint of the strength. Accordingly, the thickness is preferably from 10 to 300 μm, more preferably from 30 to 200 μm.

The synthetic resin molded material of the present invention has excellent hydrophilicity imparted as the specific oxide thin film is formed by a dry method, and has good adhesion to the substrate, whereby the affinity to various adhesives will be improved, and when laminated on other synthetic resin or metal by means of such an adhesive, a laminate having a strong bonding force can be obtained.

Or, it is possible to coat on the synthetic resin molded material of the present invention various treating agents which used to be hardly coated directly on synthetic resin substrates. Accordingly, various functional films can be formed, and it is possible to obtain synthetic resin molded materials having various functions and excellent adhesion durability. Such various functions include, for example, a drop flowing property, an ultraviolet ray insulating property, an antistatic property and an antibacterial property.

Further, with various catalytic functions represented by the photocatalytic function, it is possible to impart an anti-soiling property or an antibacterial property.

The synthetic resin molded material of the present invention may be used, for example, for windows for show casings, meters, vehicles, houses or buildings, blinds, wall papers, bath tubs, interior walls of bath rooms, interior walls of kitchens or ceiling of gas ovens, or for packaging materials, goggles, lenses for eye glasses, mirrors, curve mirrors or parabola antennas. It is particularly useful for application to covering materials for agricultural and horticultural houses (film-covering type houses or hard plate covering type houses).

BEST MODE FOR CARRYING OUT THE INVENTION

EXAMPLES

Example 1

As a synthetic resin substrate, an ETFE film (thickness: 60 μm) was prepared. In a sputtering apparatus, a substrate having the above film of 10×10 cm fixed on a glass plate of 10×10 cm, was set on an anode side, and a target made of a mixture of Si and Sn (atomic ratio of 50:50) (hereinafter referred to as target A) was set on a cathode side.

The interior of the apparatus was evacuated to about $10^{-6}$ Torr, and then argon and oxygen were introduced into the apparatus at a flow rate ratio of 1:4 to adjust the sputtering gas pressure to $5\times10^{-3}$ Torr.

Using a direct current power source, sputtering was carried out at a power density of 2.75 W/cm² to form a thin film (film thickness: about 30 nm) of oxides of Si and Sn on the film surface, to obtain a synthetic resin molded material.

To examine the degree of hydrophilicity of the surface layer of the obtained synthetic resin resin molded material, the contact angle of the film surface to water (hereinafter referred to simply as a contact angle) was measured, and the result (the initial contact angle) is shown in Table 1.

Further, to measure the film-forming speed, film forming was carried out under the same condition as the above film forming condition except that only glass was set on the anode side and the power density was changed to 5.5 W/cm². The measured film forming speed of the thin film of an oxide, is shown in Table 1.

Further, formation of thin films of oxides were carried out in various film thicknesses to examine the minimum film thickness at which the contact angle to water of the film thickness of 30 nm could be maintained. The results are shown in Table 1.

Example 2

The operation was carried out in the same manner as in Example 1 except that the direct current power source in Example 1 was changed to a radio frequency power source. With respect to the obtained synthetic resin molded material, various measurements were carried out in the same manner as in Example 1, and the results are shown in Table 1.

Example 3

The operation was carried out in the same manner as in Example 2 except that the target in Example 2 was changed to a Si target (hereinafter referred to as target B). With respect to the obtained synthetic resin molded material, various measurements were carried out in the same manner as in Example 1, and the results are shown in Table 1.

Example 4

The operation was carried out in the same manner as in Example 1 except that the target in Example 1 was changed to a target made of a mixture of Si and Sn (atomic ratio of 65:35) (hereinafter referred to as target C). With respect to the obtained synthetic resin molded material, various measurements were carried out in the same manner as in Example 1, and the results are shown in Table 1.

Example 5

The operation was carried out in the same manner as in Example 1 except that the target in Example 1 was changed to a target made of a mixture of Si and Ti (atomic ratio of 50:50) (hereinafter referred to as target D). With respect to the obtained synthetic resin molded material, various measurements were carried out in the same manner as in Example 1, and the results are shown in Table 1.

Example 6

The operation was carried out in the same manner as in Example 1 except that the target in Example 1 was changed to a target made of a mixture of Si, Sn and Ti (atomic ratio of 50:35:15) (hereinafter referred to as target E). With respect to the obtained synthetic resin molded material, various measurements were carried out in the same manner as in Example 1, and the results are shown in Table 1.

As shown in Table 1, the initial contact angles of Examples 1 to 6 are equal, whereby it was confirmed that all of them have equal hydrophilicity. As compared with the case where target B of Example 3 was used, the film forming speed was 5 times in a case where film formation was carried out by a direct current sputtering method using target A of Example 1, and twice in a case where film forming was carried out by a radio frequency sputtering method using target A of Example 2.

Example 7

The following experiment was carried out to examine the durability of hydrophilicity of the surface layer of the synthetic resin molded material having the oxide thin film layer of the present invention, i.e. to examine the drop flowing property, the durability of the film, the adhesion and the weather resistance.

In Example 7, the operation was carried out in the same manner as in Example 1 except that using target A, after evacuating the interior of the sputtering apparatus to $3 \times 10^{-5}$ Torr, argon and oxygen were introduced into the apparatus at a flow rate ratio of 1:4 to adjust the sputtering gas pressure to $2.4 \times 10^{31\ 3}$ Torr, and film formation was carried out at a power density of 2.2 W/cm$^2$ to form a thin film (film thickness: about 6 nm) of oxides of Si and Sn, to obtain a synthetic resin molded material.

With respect to the obtained synthetic resin molded material, a test for the durability of hydrophilicity was carried out. The test apparatus was such that the opening of a constant temperature water tank of 80° C. was closed with the resin molded material so that the oxide thin film side of the resin molded material was located on the water tank side, and the exterior temperature was controlled to be 23° C. In this apparatus, the oxide thin film was exposed to saturated steam at 80° C., and the time until the hydrophilicity was lost and the moisture condensation was formed, was examined.

Further, to examine the adhesion durability between the oxide thin film and the substrate, a wiping test was carried out. In the wiping test, the thin film surface was wiped with a gauze, and the number of wiping operations until the hydrophilicity was lost, and the moisture condensation was formed on the thin film surface, was measured, and the film condition was observed.

Further, to examine the heat resistance of the synthetic resin molded material, a heat cycle test was carried out. The conditions were such that one cycle consisted of two hours at 80° C., then one hour at 20° C., then two hours at −30° C. and then one hour at 20° C., and the evaluation was carried out by the number of cycles until the hydrophilicity of the oxide thin film surface was lost.

Further, to examine the weather resistance of the oxide thin film, ultraviolet radiation for 500 hours and outdoor exposure test for two years were carried out, whereupon the presence or absence of hydrophilicity was examined.

The results of the foregoing tests are shown in Table 2.

Example 8

The measurement and examination were carried out in the same manner as in Example 7 using, instead of the oxide thin film in Example 7, a silica thin film formed by coating an ethanol dispersion (solid content concentration=15 wt %) of a mixture comprising colloidal silica (OSCAL, manufactured by Shokubai Kasei Kogyo K. K.), β-(3,4-epoxycyclohexyl)ethyltrimethyoxysilane and polyoxyethylene-lauryl ether (solid content weight ratio=80:10:10). The results are shown in Table 2.

As shown in Table 2, Example 8 as a comparative example was inferior to Example 7 in the durability of hydrophilicity, the adhesion durability and the weather resistance.

TABLE 1

| | Example 1 | Example 2 | Example 3 | Example 4 | Example 5 | Example 6 |
|---|---|---|---|---|---|---|
| Initial contact angle (°) | ≦4 | ≦4 | ≦4 | ≦4 | ≦4 | ≦4 |
| Film forming speed (nm/min) | 120 | 50 | 25 | 100 | 30 | 85 |
| Hydrophilicity Minimum film thickness (nm) | 3 | 3 | 16 | 5 | 8 | 6 |

TABLE 2

| | Example 7 | Example 8 |
|---|---|---|
| Durability of hydrophilicity | Excellent hydrophilicity was maintained even after expiration of 12 months. | Hydrophilicity was lost in 10 days. |
| Adhesion durability | Excellent hydrophilicity was maintained even after 100 times. | Hydrophilicity was lost in 3 times. |
| Heat resistance | Excellent hydrophilicity was maintained even after at least 100 cycles. | Hydrophilicity was lost after 10 cycles. |
| Weather resistance | Excellent hydrophilicity was maintained even after irradiation with ultraviolet rays or outdoor exposure. | Hydrophilicity was lost by irradiation with ultraviolet rays, and a decrease in the hydrophilicity was observed by outdoor exposure. |

Examples 9 to 11

Evaluation was carried out in the same manner as Example 7 except that the target in Example 7 was changed to C, D or E, whereby the same results as in Example 7 in Table 2 was obtained.

INDUSTRIAL APPLICABILITY

The synthetic resin molded material of the present invention has sufficient hydrophilicity, and the hydrophilicity lasts for a long period of time, and at the same time, it is excellent in the productivity. Further, it is excellent in the adhesion durability between the film and the substrate and also excellent in the weather resistance, whereby it is useful for applications where durability is required.

Further, the synthetic resin molded material of the present invention is capable of effectively preventing moisture condensation. Accordingly, when it is used, for example, for an agricultural vinyl house, it is possible to prevent such a drawback that incidence of sunlight is prevented by moisture condensation, or water drops deposited on the resin surface will drop on crop plants without flowing along the resin surface.

Further, the synthetic resin molded material of the present invention has excellent hydrophilicity imparted, whereby affinity to various adhesives will be improved, and the adhesion to a substrate will be excellent. Accordingly, it makes bonding to a substrate such as a resin having hydrophobicity, which used to be difficult to bond, possible, and it is thereby possible to provide a laminate having a strong adhesive force.

And, as compared with conventional coating film, desired functions can be attained with a film thickness smaller by at least one figure, whereby the required functions can be imparted without impairing transparency or flexibility of the resin itself.

The invention claimed is:

1. A synthetic resin molded material comprising a thin film made of a mixture comprising a Si oxide and a Sn oxide, wherein the Si content is from 50 to 70 atomic % of the total of Si and Sn, and formed by a dry method on a synthetic resin substrate having hydrophobicity.

2. The synthetic resin molded material according to claim 1, wherein said thin film has a thickness of up to 100 nm.

3. The synthetic resin molded material according to claim 1, wherein said thin film has a thickness of from 3 to 30 nm.

4. The synthetic resin molded material according to claim 1, wherein said synthetic resin substrate is a tetrafluoroethylene-containing resin.

5. The synthetic resin molded material according to claim 4, wherein said tetrafluoroethylene-containing resin is a tetrafluoroethylene/ethylene copolymer.

6. The synthetic resin molded material according to claim 5, wherein the tetrafluoroethylene/ethylene copolymer comprises tetrafluoroethylene/ethylene in a molar ratio of 40/60 to 70/30, and optionally comprises additionally from 0.3 to 10 mol % of comonomer components other than tetrafluoroethylene and ethylene.

7. The synthetic resin molded material according to claim 1, wherein said oxide of Si comprises $SiO_2$.

8. The synthetic resin molded material according to claim 1, wherein said thin film additionally comprises an oxide of Ti as the main components.

9. The synthetic resin molded material according to claim 1, wherein said dry method is a sputtering method.

10. The synthetic resin molded material according to claim 9, wherein said sputtering method comprises reactive sputtering in an oxygen-containing atmosphere using a target comprising a mixture of Si and Sn.

11. The synthetic resin molded material according to claim 10, wherein the target comprises Si:Sn in an atomic ratio of 65:35.

12. The synthetic resin molded material according to claim 10, wherein the target comprises Si:Sn in an atomic ratio of 50:50.

13. The synthetic resin molded material according to claim 1, wherein the substrate has a thickness of from 10 to 300 µm.

14. The synthetic resin molded material according to claim 13, wherein the substrate has a thickness of from 30 to 200 µm.

15. The synthetic resin molded material according to claim 1, which has an initial contact angle of $\leq 40°$.

16. The synthetic resin molded material according to claim 1, which has been coated with a functional film thereon.

17. The synthetic resin molded material according to claim 16, wherein the functional film imparts at least one property selected from the group consisting of drop flowing, ultraviolet ray insulating, antistatic, antibacterial and antisoiling.

18. An agricultural or horticultural house comprising a covering material made from the synthetic resin molded material according to claim 1.

* * * * *